(12) United States Patent
Chang

(10) Patent No.: US 11,507,390 B2
(45) Date of Patent: Nov. 22, 2022

(54) IDENTIFIER AUTOMATIC ASSIGNING DATA PROCESSING BOARD, DATA PROCESSING MODULE INCLUDING IDENTIFIER AUTOMATIC ASSIGNING DATA PROCESSING BOARD AND DATA PROCESSING SYSTEM INCLUDING DATA PROCESSING MODULE

(71) Applicant: SAMIN SCIENCE CO., LTD., Gyeonggi-do (KR)

(72) Inventor: Hyo Cheol Chang, Incheon (KR)

(73) Assignee: SAMIN SCIENCE CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/174,489

(22) Filed: Feb. 12, 2021

(65) Prior Publication Data

US 2021/0255875 A1  Aug. 19, 2021

(30) Foreign Application Priority Data

Feb. 18, 2020 (KR) .................. 10-2020-0019786

(51) Int. Cl.
*G06F 9/4401* (2018.01)
*G01R 19/00* (2006.01)
*G06F 11/30* (2006.01)
*G06F 11/34* (2006.01)
*G06F 13/40* (2006.01)
(Continued)

(52) U.S. Cl.
CPC ........ *G06F 9/4411* (2013.01); *G01R 19/0084* (2013.01); *G06F 11/3041* (2013.01); *G06F 11/3089* (2013.01); *G06F 11/3485* (2013.01); *G06F 13/4022* (2013.01)

(58) Field of Classification Search
CPC .................................. G06F 1/32; G01R 1/00
See application file for complete search history.

(56) References Cited

U.S. PATENT DOCUMENTS 4,654,658 A * 3/1987 Walton ................. A01K 11/006
340/12.51
2011/0115475 A1* 5/2011 Li ....................... H03K 19/1732
324/140 R
(Continued)

FOREIGN PATENT DOCUMENTS

JP    2011-151622 A    8/2011
JP    2011-155356 A    8/2011
(Continued)

OTHER PUBLICATIONS

Office action dated Apr. 6, 2020 from Korean Patent Office in a counterpart Korean Patent Application No. 10-2020-0019786 (English translation is also submitted herewith.).

*Primary Examiner* — Getente A Yimer
(74) *Attorney, Agent, or Firm* — The PL Law Group, PLLC

(57) ABSTRACT

A data processing board according to an embodiment of the present disclosure includes a data processing module including at least one data processing board for automatically assigning an identifier according to the voltage value measured in the internal circuit and a communication board for transmitting and receiving signal to/from the data processing board, and a data processing system including the data processing module and a monitor collecting device for selecting and parallel-processing the data received from the data processing module.

11 Claims, 10 Drawing Sheets

(51) Int. Cl.
  *G01R 31/28* (2006.01)
  *G06F 11/00* (2006.01)
  *G06F 13/38* (2006.01)
  *G01R 1/20* (2006.01)
  *G01R 15/14* (2006.01)
  *G06F 13/42* (2006.01)
  *G06Q 50/10* (2012.01)

(56) References Cited

U.S. PATENT DOCUMENTS

2012/0096291 A1\* 4/2012 Guang .................. H02J 3/14
                                                              713/321
2020/0201810 A1\* 6/2020 Felix .................. G06F 15/177

FOREIGN PATENT DOCUMENTS

| | | |
|---|---|---|
| JP | 2018-046413 A | 3/2018 |
| KR | 101745818 B1 | 6/2017 |
| KR | 101965321 B1 | 8/2019 |

\* cited by examiner

IDENTIFIER AUTOMATIC ASSIGNING DATA PROCESSING BOARD, DATA PROCESSING MODULE INCLUDING IDENTIFIER AUTOMATIC ASSIGNING DATA PROCESSING BOARD AND DATA PROCESSING SYSTEM INCLUDING DATA PROCESSING MODULE

CROSS-REFERENCE TO RELATED APPLICATIONS

This application claims the benefit of Korean Patent Application No. 10-2020-0019786, filed on Feb. 18, 2020, in the Korean Intellectual Property Office, the disclosure of which is incorporated herein by reference in its entirety.

BACKGROUND

Technical Field

This disclosure relates to an identifier automatic assigning data processing board, a data processing module including the identifier automatic assigning data processing board, and a data processing system including the data processing module, and more particularly, to a data processing board for assigning an identifier according to a voltage value measured in an internal circuit, a data processing module including at least one data processing board for assigning an identifier according to a voltage value measured in the internal circuit and a communication board for transmitting and receiving data with the data processing board, and a data processing system including a data processing module and a monitor collecting device for selecting data received from the data processing module and parallel-processing the data.

Background Art

In a laboratory equipped with various chemical substances and experimental equipment, data on the laboratory environment must be collected and monitored at all times to ensure user safety.

In general, a sensor device for detecting an abnormal condition inside the laboratory or in the experimental equipment, and safety devices for terminating an abnormal condition when the abnormal condition occurs inside the laboratory or in the experimental equipment and ensuring the safety of users are provided inside the laboratory or in the experimental equipment.

However, simply providing individual sensor devices or safety devices is not enough to guarantee the safety of users as much as possible, and there is a need for an integrated management system capable of efficiently operating and managing various sensor devices and safety devices provided inside a laboratory or in an experimental equipment.

SUMMARY

The present disclosure is designed from the above background, and the present disclosure is directed to providing a data processing board, which may automatically assign an identifier according to a voltage value measured in an internal circuit, change the internal circuit according to a serial connection state when a plurality of data processing boards are connected in series, and automatically assign an identifier based on each voltage value measured in the changed internal circuit.

In addition, the present disclosure is directed to providing a data processing module, which includes a data processing board capable of being assigned with an identifier according to a serial connection state when a plurality of data processing boards are connected in series and capable of being connected to various sensors and actuators and a communication module for transmitting and receiving data to/from the data processing board.

In addition, the present disclosure is directed to providing a data processing system, which may process data more efficiently by including a data processing module for collecting sensing data and selecting and parallel-processing the sensing data received from the data processing module.

The aspect of the present disclosure is not limited thereto, and other aspects not mentioned will be clearly understood by those skilled in the art from the following description.

In order to accomplish one or more of the above aspects, an embodiment of the present disclosure provides an identifier automatic assigning data processing board for assigning an identifier according to a voltage value measured in an internal circuit, comprising: a first input pin configured to receive a power from an external power source or another data processing board connected in series; a resistor unit having one end connected in series to the first input pin; a voltage measuring unit connected in series to the other end of the resistor unit to measure a voltage value at the other end of the resistor unit; an identifier assigning unit configured to assign the identifier based on the voltage value measured by the voltage measuring unit; and a switching unit connected in series to the voltage measuring unit and configured to shift a switch from an ON state to an OFF state when still another data processing board is connected in series.

In addition, an embodiment of the present disclosure provides a data processing module including an identifier automatic assigning data processing board, the data processing module comprising: at least one data processing board connected to at least one of a sensor and an actuator to transmit and receive a processing signal and configured to assign an identifier according to a voltage value measured in an internal circuit; and a communication board configured to make a call to the data processing board through the identifier and transmit and receive the processing signal to/from the data processing board according to a response of the data processing board to the call.

In addition, an embodiment of the present disclosure provides a data processing system including a data processing module, the data processing system comprising: at least one data processing module including at least one data processing board connected to at least one of a sensor and an actuator to transmit and receive any one of sensing data output by the sensor and a control signal for controlling an operation of the actuator, and a communication board for collecting the sensing data from the data processing board; and a monitor collecting device configured to receive the sensing data from the communication board and perform data processing for the sensing data.

According to the identifier automatic assigning data processing board according to an embodiment of the present disclosure, since the data processing board automatically assigns an identifier according to the voltage value measured in the internal circuit, a separate procedure for assigning the identifier to the data processing board is not required.

In addition, since the internal circuit is formed differently by the switching unit depending on whether still another data processing board is connected in series to the data processing board, even if a plurality of still other data processing boards are sequentially connected in series to the data processing board, all of the data processing board and the plurality of still other data processing boards sequentially connected in series may be automatically assigned with an identifier.

Meanwhile, since the data processing module including the identifier automatic assigning data processing board according to an embodiment of the present disclosure includes a data processing board configured to automatically assign an identifier according to the voltage value measured in the internal circuit and also assigns an identifier by constituting the internal circuit differently according to the serial connection state, there is an effect of giving an expandability that can increase the number of data processing boards according to an environment of an experiment space or an experiment device managed by the data processing module.

In addition, by providing the data processing board that may be connected with various types of sensors and actuators to transmit and receive processing signals, the type of sensors and actuators connected to the data processing board may be changed in various ways according to the environment of an experiment space or an experiment device managed by the data processing module.

Meanwhile, the data processing system including the data processing module according to an embodiment of the present disclosure has an effect of more efficiently processing data by selectively processing the sensing data received from the data processing module according to the type value.

In addition, since data processing for a sensing value contained in the sensing data and detecting whether an event occurs by the sensing value contained in the sensing data are performed separately in parallel, data processing may be performed more efficiently.

DETAILED DESCRIPTION

Figure 1:
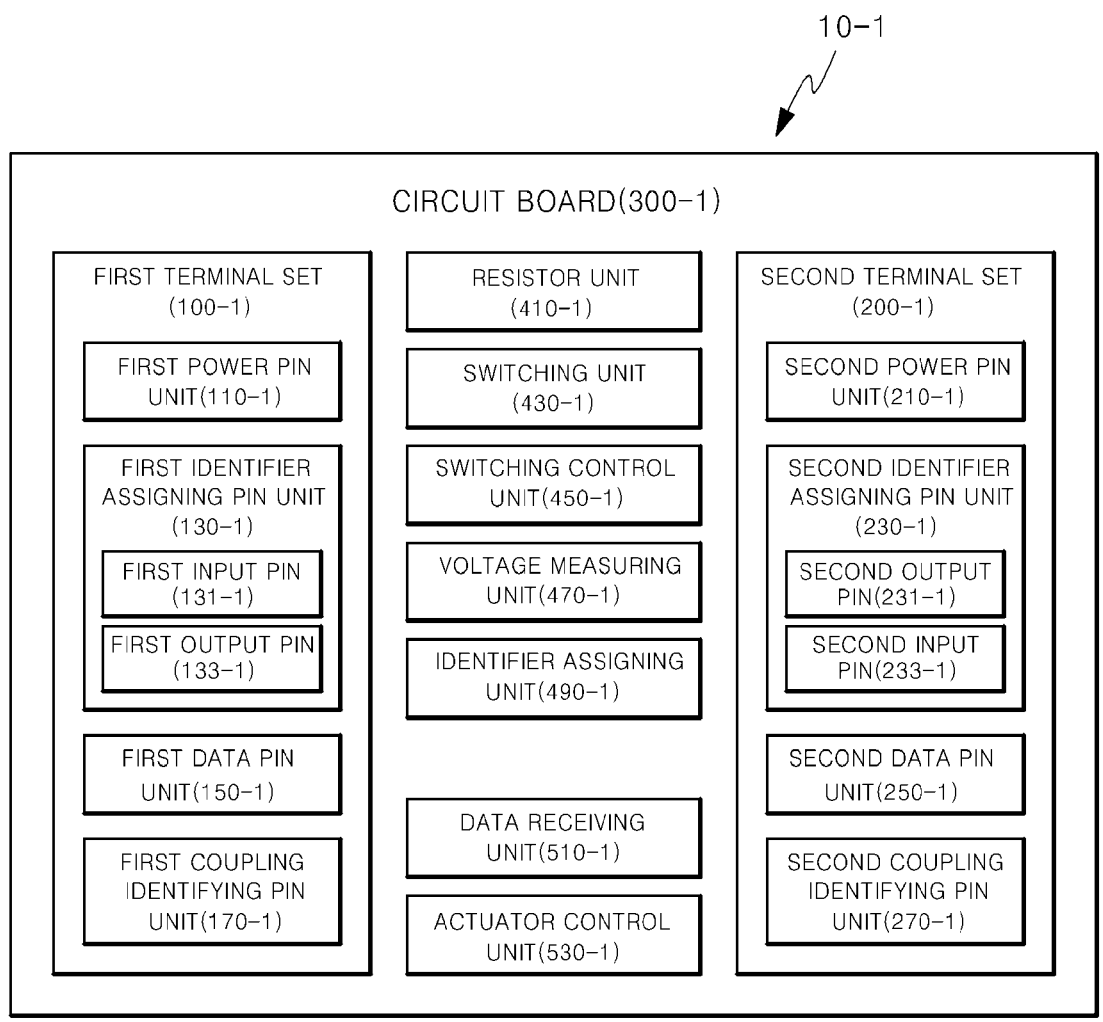
FIG. 1 is a diagram showing an overall configuration of a data processing board according to an embodiment of the present disclosure.

Hereinafter, some embodiments of the present disclosure will be described in detail with reference to exemplary drawings. In adding reference signs to components of each drawing, it should be noted that the same components have the same numerals as possible even if they are indicated on different drawings. In addition, in the present disclosure, if it is determined that a detailed description of a related known configuration or function may obscure the subject matter of the present disclosure, the detailed description thereof will be omitted.

In addition, in describing the components of the present disclosure, terms such as first, second, A, B, (a) and (b) may be used. These terms are only for distinguishing the component from other components, and are not intended to limit the nature, order or sequence of the component. When a component is described as being "connected", "coupled" or "accessed" to another component, the component may be directly connected or accessed to that other component, but it should be understood that another component may be "connected", "coupled" or "accessed" between them.

First, as shown in FIGS. 1 to 5, an identifier automatic assigning data processing board 10-1 according to an embodiment of the present disclosure is a data processing board 10-1 that assigns an identifier according to a voltage value measured in an internal circuit, and includes a first input pin 131-1 for receiving a power V from an external power source 1 or another data processing board 10-2 connected in series; a resistor unit 410-1 having one end connected in series to the first input pin 131-1; a voltage measuring unit 470-1 connected in series to the other end of the resistor unit 410-1 to measure a voltage value at the other end of the resistor unit 410-1; an identifier assigning unit 490-1 for assigning an identifier based on the voltage value measured by the voltage measuring unit 470-1; and a switching unit 430-1 connected in series to the voltage measuring unit 470-1 to shift a switch from an ON state to an OFF state when still another data processing board 10-3 is connected in series.

The identifier automatic assigning data processing board 10-1 according to an embodiment of the present disclosure is a data processing board 10-1 that automatically assigns an identifier according to a voltage value measured in the internal circuit.

Generally, a conventional data processing board individually assigns an identifier for communication with an external terminal when the data processing board is produced.

The data processing board 10-1 according to an embodiment of the present disclosure is not assigned with an identifier when the data processing board 10-1 is produced, but an identifier is automatically assigned according to the voltage value measured in the internal circuit provided to the data processing board 10-1.

Moreover, the data processing board 10-1 according to an embodiment of the present disclosure is provided to be combined with or separated from another data processing board 10-2 or still another data processing board 10-3. If another data processing board 10-2 or still another data processing board 10-3 is coupled and electrically connected, an identifier is automatically assigned according to the voltage value changed by the electrical connection.

That is, the data processing board 10-1 according to an embodiment of the present disclosure may variably assign an identifier based on the voltage value changed according to whether another data processing board 10-2 or still another data processing board 10-3 is coupled.

Meanwhile, another data board 10-2 and still another data board 10-3 have the same configuration as the data processing board 10-1 according to an embodiment of the present disclosure.

Therefore, the description of each component included in the data processing board 10-1 according to an embodiment of the present disclosure may be identically applied to another data board 10-2 and still another data board 10-3.

Meanwhile, the identifier automatically assigned to the data processing board 10-1 according to an embodiment of the present disclosure is, for example, a unique address assigned to the data processing board 10-1 such that a master terminal connected to at least one data processing board 10-1 performs a polling operation.

Hereinafter, each component of the data processing board 10-1 according to an embodiment of the present disclosure will be described in detail with reference to FIGS. 1 to 5.

First, as shown in FIG. 1, the data processing board 10-1 according to an embodiment of the present disclosure includes a circuit board 300-1 that forms a conductor wiring.

The circuit board 300-1 is a substrate that forms a circuit wiring through a conductor with electric conductivity, and may be formed in a double-sided or laminated structure like a conventional printed circuit board.

Meanwhile, the circuit board 300-1 may include a first terminal set 100-1 at one side and a second terminal set 200-1 at the other side.

The first terminal set 100-1 may include a first power pin unit 110-1, a first identifier assigning pin unit 130-1, a first data pin unit 150-1, and a first coupling identifying pin unit 170-1, and the second terminal set 200-1 may include a second power pin unit 210-1, a second identifier assigning pin unit 230-1, a second data pin unit 250-1, and a second coupling identifying pin unit 270-1.

First, each of the first power pin unit 110-1 and the second power pin unit 210-1 may include a V+ pin and a V− pin, and the first power pin unit 110-1 and the second power pin unit 210-1 may be electrically connected to each other through a conductor wiring formed in the circuit board 300-1.

Subsequently, the first identifier assigning pin unit 130-1 may include a first input pin 131-1 and a first output pin 133-1, the second identifier assigning pin unit 230-1 is a second output pin 231-1 and a second input pin 233-1, and the first identifier assigning pin unit 130-1 and the second identifier assigning pin unit 230-1 may be electrically connected to each other through the conductor wiring formed in the circuit board 300-1.

Subsequently, each of the first data pin unit 150-1 and the second data pin unit 250-1 may include a DATA+ pin and a DATA− pin, the first data pin unit 150-1 and the second data pin unit 250-1 may be electrically connected to each other through the conductor wiring formed in the circuit board 300-1, and the first data pin unit 150-1 and the second data pin unit 250-1 may be electrically connected to each other to form a data bus.

Subsequently, each of the first coupling identifying pin unit 170 and the second coupling identifying pin unit 270 may include an input pin and an output pin.

Meanwhile, the first terminal set 100-1 provided to the data processing board 10-1 according to an embodiment of the present disclosure may be formed to be coupled to or separated from the second terminal set provided to another data processing board 10-2.

If the first terminal set 100-1 provided to the data processing board 10-1 according to an embodiment of the present disclosure and the second terminal set provided to another data processing board 10-2 are coupled, the first power pin unit 110-1, the first identifier assigning pin unit 130-1, the first data pin unit 150-1 and the first coupling identifying pin unit 170-1 provided to the first terminal set 100-1 and the second power pin unit, the second identifier assigning pin unit, the second data pin unit and the second coupling identifying pin unit provided to the second terminal set of another data processing board 10-2 may be electrically connected to each other, respectively.

In addition, the second terminal set 200-1 provided to the data processing board 10-1 according to an embodiment of the present disclosure may be formed to be coupled to or separated from the first terminal set provided to still another data processing board 10-3.

If the second terminal set 200-1 provided to the data processing board 10-1 according to an embodiment of the present disclosure and the first terminal set of still another data processing board 10-3 are coupled, the second power pin unit 210-1, the second identifier assigning pin unit 230-1, the second data pin unit 250-1 and the second coupling identifying pin unit 270-1 provided to the second terminal set 200-1 and the first power pin unit, the first identifier assigning pin unit, the first data pin unit and the first coupling identifying pin unit provided to the first terminal set of still another data processing board 10-3 may be electrically connected to each other, respectively.

Meanwhile, the data processing board 10-1 according to an embodiment of the present disclosure may include a resistor unit 410-1, a switching unit 430-1, a switching control unit 450-1, a voltage measuring unit 470-1 and an identifier assigning unit 490-1 on the circuit board 300-1.

Hereinafter, a method of automatically assigning an identifier to the data processing board 10-1 according to an embodiment of the present disclosure will be described with reference to FIGS. 2 to 5.

First, the first input pin 131-1 receives a power V from the external power source 1 or another data processing board 10-2 connected in series.

Figure 2:
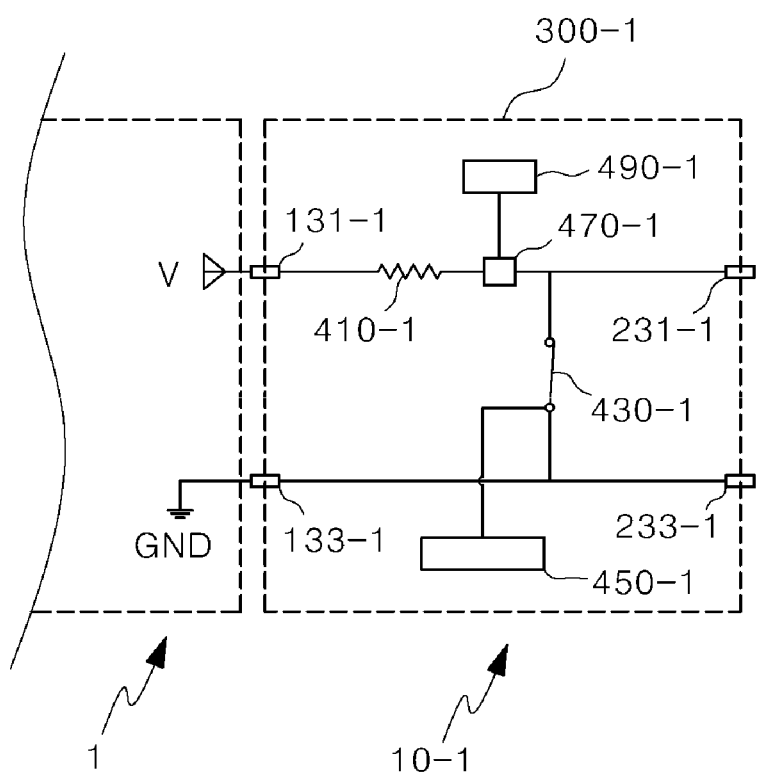
FIG. 2 is a circuit diagram showing that an external power source is connected to the data processing board according to an embodiment of the present disclosure.

As shown in FIG. 2, the data processing board 10-1 may be coupled and electrically connected to the external power source 1, and the first input pin 131-1 may receive a predetermined power V from the external power source 1.

Here, the external power source 1 may be a communication board 20 provided to a data processing module 30 according to an embodiment of the present disclosure, explained later. If the data processing board 10 is coupled and electrically connected to the communication board 20, the first input pin 131-1 may receive the predetermined power V from the communication board 20.

Figure 3:
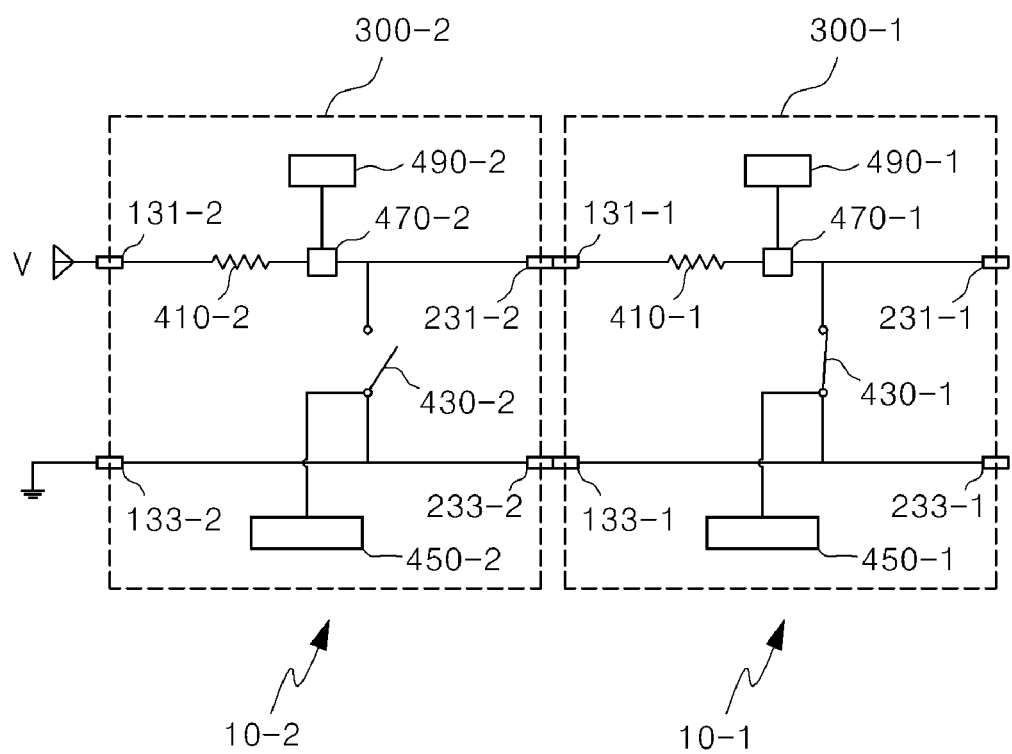
FIG. 3 is a circuit diagram showing that another data processing board is connected to the data processing board according to an embodiment of the present disclosure.

In addition, as shown in FIG. 3, if the data processing board 10-1 is connected to another data processing board 10-2 in series, the predetermined power V may be applied from another data processing board 10-2.

More specifically, the first input pin 131-1 may be connected in series to the second output pin 231-2 of another data processing board 10-2 and electrically connected thereto to receive the predetermined power V.

Meanwhile, another data processing board 10-2 may also receive a predetermined power V from the external power source 1 or the like. At this time, the predetermined power V applied to the first input pin 131-1 of the data processing board 10-1 may be a power V where a voltage drop is caused by the resistor unit 410-2 of another data processing board 10-2.

Subsequently, one end of the resistor unit 410-1 is connected in series to the first input pin 131-1.

One end of the resistor unit 410-1 is connected in series to the first input pin 131-1 to drop the voltage of the power V applied to the first input pin 131-1.

Subsequently, the voltage measuring unit 470-1 is connected in series to the other end of the resistor unit 410-1 to measure the voltage value at the other end of the resistor unit 410-1.

At this time, the voltage value at the other end of the resistor unit 410-1 may be changed depending on whether still another data processing board 10-3 is connected in series to the data processing board 10-1. Thus, the voltage measuring unit 470-1 is connected in series to the other end of the resistor unit 410-1 to measure the changing voltage value at the other end of the resistor unit 410-1.

Subsequently, the identifier assigning unit 490-1 assigns an identifier based on the voltage value measured by the voltage measuring unit 470-1.

The identifier assigning unit 490-1 automatically assigns an identifier to the data processing board 10-1 based on the voltage value measured by the voltage measuring unit 470-1. For example, the identifier assigning unit 490-1 may include an analog-digital converter (ADC) to convert the measured voltage value into a digital value and assign an identifier to the data processing board 10-1 based on the converted digital value.

Subsequently, the switching unit 430-1 is connected in series to the voltage measuring unit 470-1, and shifts the switch from an ON state to an OFF state when still another data processing board 10-3 is connected in series.

The switching unit 430-1 turns on or off the switch according to whether still another data processing board 10-3 is connected in series to the data processing board 10-1.

More specifically, the switching unit 430-1 may control the on/off operation of the switch by the switching control unit 450-1. Here, when still another data processing board 10-3 is connected in series to the data processing board 10-1, the switching control unit 450-1 controls the switching unit 430-1 to turn off the switch, and when still another data processing board 10-3 is disconnected, the switching control unit 450-1 controls the switching unit 430-1 to turn on the switch.

At this time, the switching control unit 450-1 may control the on/off operation of the switching unit 430-1 according to a coupling identification signal formed by a circuit unit including the first coupling identifying pin unit 170-1 and a predetermined pull-up resistor or a coupling identification signal formed by a circuit unit including the second coupling identifying pin unit 270-1 and a predetermined pull-up resistor.

More specifically, the circuit unit including the first coupling identifying pin unit 170-1 and the predetermined pull-up resistor may generate a coupling identification signal (1 or 0) depending on whether the external power source 1 or the second coupling identifying pin unit of another data processing board 10-2 is electrically connected to the first coupling identifying pin unit 170-1.

In addition, the circuit unit including the second coupling identifying pin unit 270-1 and the predetermined pull-up resistor may generate a coupling identification signal (1 or 0) depending on whether the first coupling identifying pin unit of still another data processing board 10-3 is electrically connected to the second coupling identifying pin unit 270-1.

As described above, the first identifier assigning pin unit 130-1 and the first coupling identifying pin unit 170-1 may be provided together in the first terminal set 100-1. Accordingly, if the first coupling identifying pin unit 170-1 is connected to the external power source 1 or the second coupling identifying pin unit of another data processing board 10-2, the first identifier assigning pin unit 130-1 is also connected to the external power source 1 or the second identifier assigning pin unit of another data processing board 10-2.

In addition, the second identifier assigning pin unit 230-1 and the second coupling identifying pin unit 270-1 may be provided together in the second terminal set 200-1. Accordingly, if the second coupling identifying pin unit 270-1 is connected to the first coupling identifying pin unit of still another data processing board 10-3, the second identifier assigning pin unit 230-1 is also connected to the first identifier assigning pin unit of still another data processing board 10-3.

Therefore, the switching control unit 450-1 may identify whether the first identifier assigning pin unit 130-1 is connected to the external power source 1 or the second identifier assigning pin unit of another data processing board 10-2 by the electrical connection of the first coupling identifying pin unit 170-1.

In addition, the switching control unit 450-1 may identify whether the second identifier assigning pin unit 230-1 is connected to the first identifier assigning pin unit of still another data processing board 10-3 by the electrical connection of the second coupling identifying pin unit 270-1.

Here, as shown in FIGS. 2 and 3, if the first input pin 131-1 and the first output pin 133-1 are connected to the external power source 1 or respectively connected in series to the second output pin 231-2 and the second input pin 233-2 of another data processing board 10-2 and the second output pin 231-1 and second input pin 233-1 are not connected in series respectively to the first input pin 131-3 and the first output pin 133-3 of still another data processing board 10-3, the switching control unit 450-1 may control the switch of the switching unit 430-1 to turn on.

Figure 4:
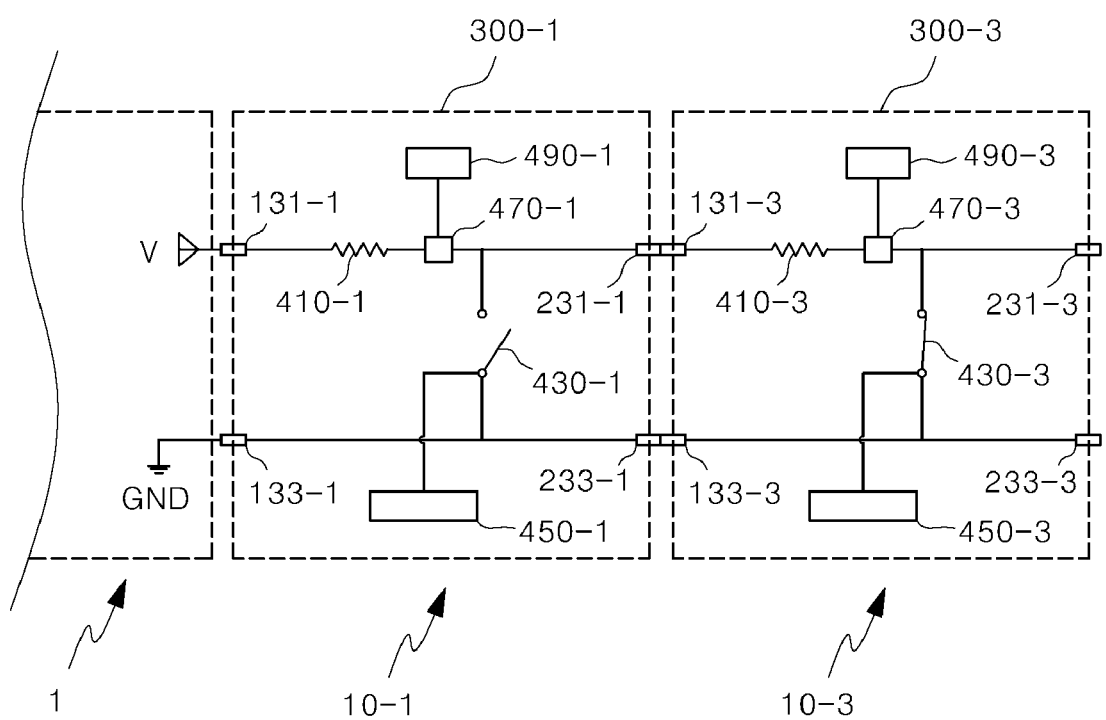
FIG. 4 is a circuit diagram showing that an external power source and a still another data processing board are connected to the data processing board according to an embodiment of the present disclosure.
Figure 5:
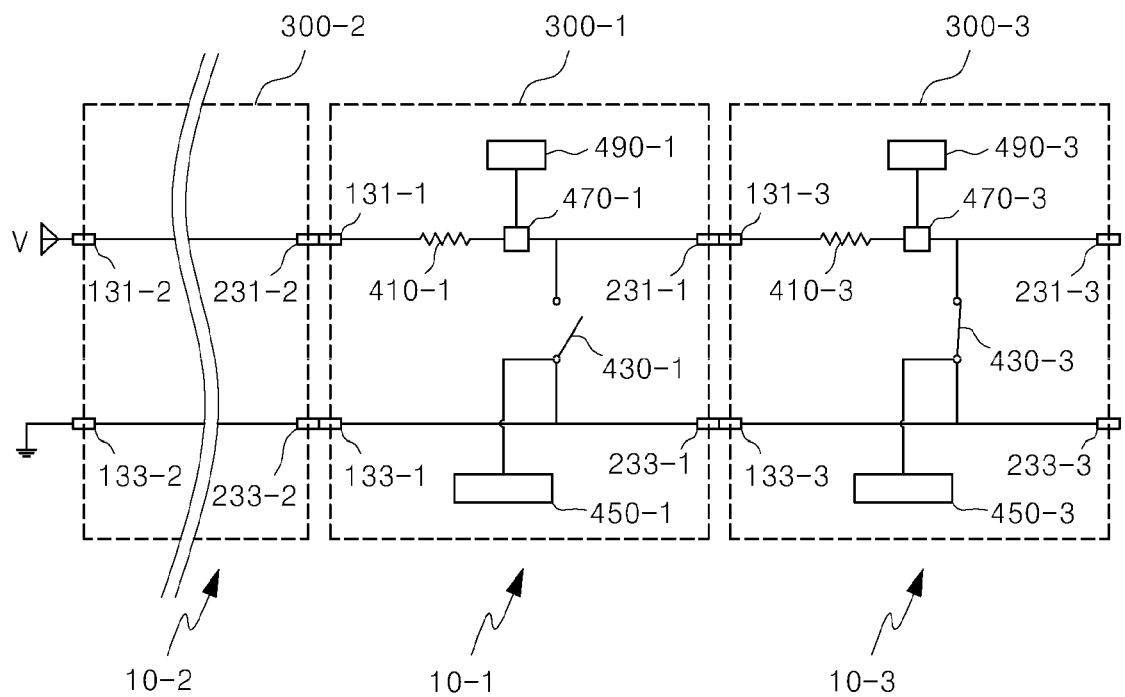
FIG. 5 is a circuit diagram showing that another data processing board and a still another data processing board are connected to the data processing board according to an embodiment of the present disclosure.

In addition, as shown in FIGS. 4 and 5, if the first input pin 131-1 and the first output pin 133-1 are connected to the external power source 1 or respectively connected in series to the second output pin 231-2 and the second input pin 233-2 of another data processing board 10-2 and the second output pin 231-1 and the second input pin 233-1 are also respectively connected in series to the first input pin 131-3 and the first output pin 133-3 of still another data processing board 10-3, the switching control unit 450-1 may control the switch of the switching unit 430-1 to turn off.

That is, in a state where the external power source 1 or another data processing board 10-2 is connected to the data processing board 10-1, the switching unit 430-1 of the data processing board 10-1 turns on or off the switch according to the control of the switching control unit 450-1 depending on whether still another data processing board 10-3 is connected in series.

Subsequently, the data processing board 10-1 includes a first output pin 133-1 having the other end connected in series to the switching unit 430-1 and one end connected in series to the ground (GND) of the external power source 1 or the second input pin 233-2 of another data processing board 10-2.

The other end of the first output pin 133-1 is connected in series to the switching unit 430-1, and if the data processing board 10-1 is connected to the external power source 1, one end of the first output pin 133-1 is connected to the ground (GND) of the external power source 1.

As a result, as shown in FIG. 2, the data processing board 10-1 may form a closed circuit (hereinafter, a first closed circuit) including the first input pin 131-1, the resistor unit 410-1, the voltage measuring unit 470-1, the switching unit 430-1 and the first output pin 133-1.

In addition, the other end of the first output pin 133-1 is connected in series to the switching unit 430-1, and if the data processing board 10-1 is connected in series to another data processing board 10-2, one end of the first output pin 133-1 is connected in series to the second input pin 233-2 of another data processing board 10-2.

As a result, as shown in FIG. 3, the data processing board 10-1 may form a closed circuit (hereinafter, a second closed circuit) including the first input pin 131-2, the resistor unit 410-2, the voltage measuring unit 470-2, the second output pin 231-2, the first input pin 131-1, the resistor unit 410-1, the voltage measuring unit 470-1, the switching unit 430-1, the first output pin 133-1, the second input pin 233-2 and the first output pin 133-2.

Subsequently, the data processing board 10-1 includes a second output pin 231-1 having one end connected in series to the voltage measuring unit 470-1 and the other end connected in series to the first input pin 131-3 of still another data processing board when still another data processing board 10-3 is connected in series.

In addition, the data processing board 10-1 includes a second input pin 233-1 having one end connected in series to the first output pin 133-1 and the other end connected in series to the first output pin 133-3 of still another data processing board 10-3 when still another data processing board 10-3 is connected in series.

As a result, as shown in FIG. 4, if the external power source 1 is connected to the data processing board 10-1, the data processing board 10-1 may form a closed circuit (hereinafter, a third closed circuit) including the first input pin 131-1, the resistor unit 410-1, the voltage measuring unit 470-1, the second output pin 231-1, the first input pin 131-3, the resistor unit 410-3, the voltage measuring unit 470-3, the switching unit 430-3, the first output pin 133-3, the second input pin 233-1 and the first output pin 133-1.

In addition, as shown in FIG. 5, when another data processing board 10-2 is connected in series to the data processing board 10-1, the data processing board 10-1 may form a closed circuit (hereinafter, a fourth closed circuit) including the first input pin 131-2, the resistor unit 410-2, the voltage measuring unit 470-2, the second output pin 231-2, the first input pin 131-1, the resistor unit 410-1, the voltage measuring unit 470-1, the second output pin 231-1, the first input pin 131-3, the resistor unit 410-3, the voltage measuring unit 470-3, the switching unit 430-3, the first output pin 133-3, the second input pin 233-1, the first output pin 133-1, the second input pin 233-2 and the first output pin 133-2.

Meanwhile, when still another data processing board 10-3 is connected in series, the identifier assigning unit 490-1 is characterized by assigning an identifier based on a voltage value changed according to the serial connection of still another data processing board 10-3.

As described above, when still another data processing board 10-3 is not connected in series to the data processing board 10-1, the first closed circuit or the second closed circuit is formed, and if still another data processing board 10-3 is connected in series, the third closed circuit or the fourth closed circuit is formed.

At this time, since the resistor unit 410-1 of the data processing board 10-1 and the resistor unit 410-3 of still another data processing board 10-3 included in the third closed circuit or the resistor unit 410-1 of the data processing board 10-1 and the resistor unit 410-3 of still another data processing board 10-3 included in the fourth closed circuit are connected with each other in series, the voltage value measured by the voltage measuring unit 470-1 in the first closed circuit or the second closed circuit is different from the voltage value measured by the voltage measuring unit 470-1 in the third closed circuit or the fourth closed circuit.

At this time, the identifier assigning unit 490-1 may assign an identifier according to the changed voltage value if the voltage value measured by the voltage measuring unit 470-1 changes as still another data processing board 10-3 is connected in series to the data processing board 10-1.

Meanwhile, if still another data processing board 10-3 is connected in series to the data processing board 10-1, the identifier assigning unit 490-3 of still another data processing board 10-3 may also assign an identifier to still another data processing board 10-3 according to the voltage value measured by the voltage measuring unit 470-3.

Here, even when a data processing board (not shown) is connected in series to still another data processing board 10-3, an identifier may be assigned to each of the data processing board 10-1, still another data processing board 10-3 and data processing board coupled to still another data processing board 10-3 in the same manner as above.

Meanwhile, the data processing board 10-1 according to an embodiment of the present disclosure may include a data receiving unit 510-1 and an actuator control unit 530-1.

The data processing board 10-1 may be equipped with a dip switch and set to have different functions according to the operation of the dip switch. Also, according to the set function, at least one of a sensor 2 and an actuator 3 is connected to the data processing board 10-1.

Here, the sensor 2 may include, for example, a digital-type sensor such as a capacitance sensor or an analog-type sensor such as a pressure sensor.

In addition, the actuator 3 may include, for example, a buzzer, a warning lamp, a solenoid valve or the like.

The data receiving unit 510-1 may be connected to the sensor 2 to receive sensing data D output by the sensor 2, and the actuator control unit 530-1 may be connected to the actuator 3 to receive a control signal S-c from the communication board 20 provided in the data processing module 30, explained later, to control the operation of the actuator 3 according to the control signal S-c.

Meanwhile, the data processing board 10-1 according to an embodiment of the present disclosure may receive the sensing data D from the sensor 3, but does not perform a specific data processing function.

Accordingly, the data processing board 10-1 may minimize the power demanded to the data processing board 10-1 by using a low-performance microcontroller unit (MCU).

Figure 6:
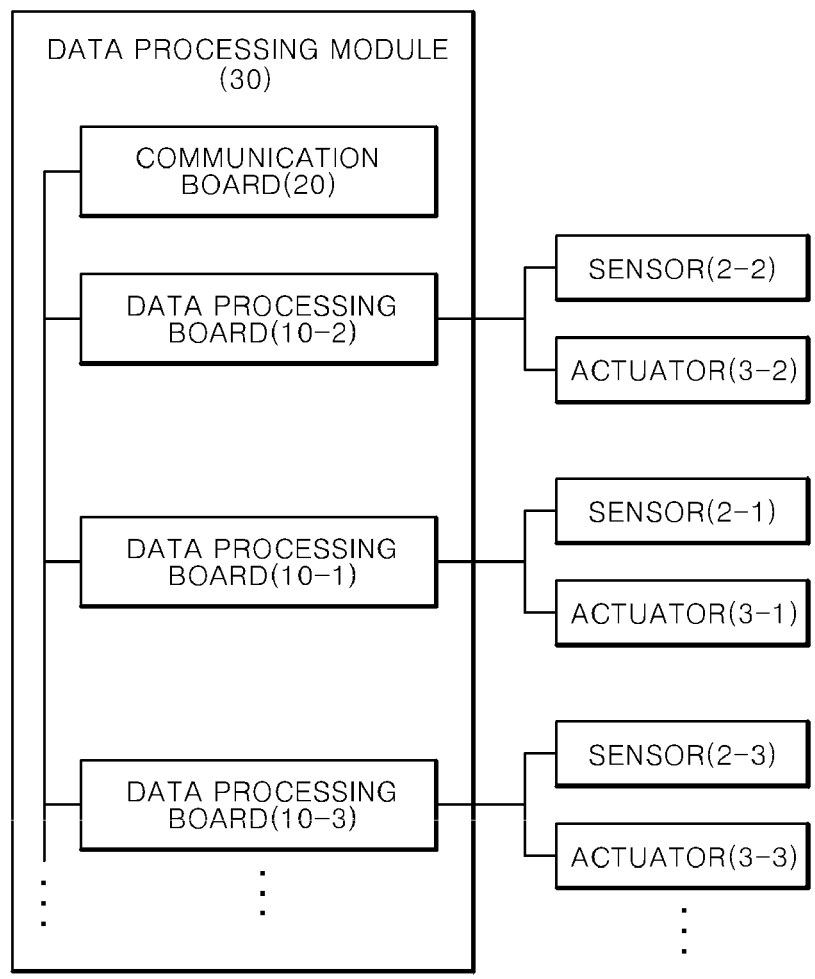
FIG. 6 is a block diagram showing an overall configuration of a data processing module according to an embodiment of the present disclosure.
Figure 7:
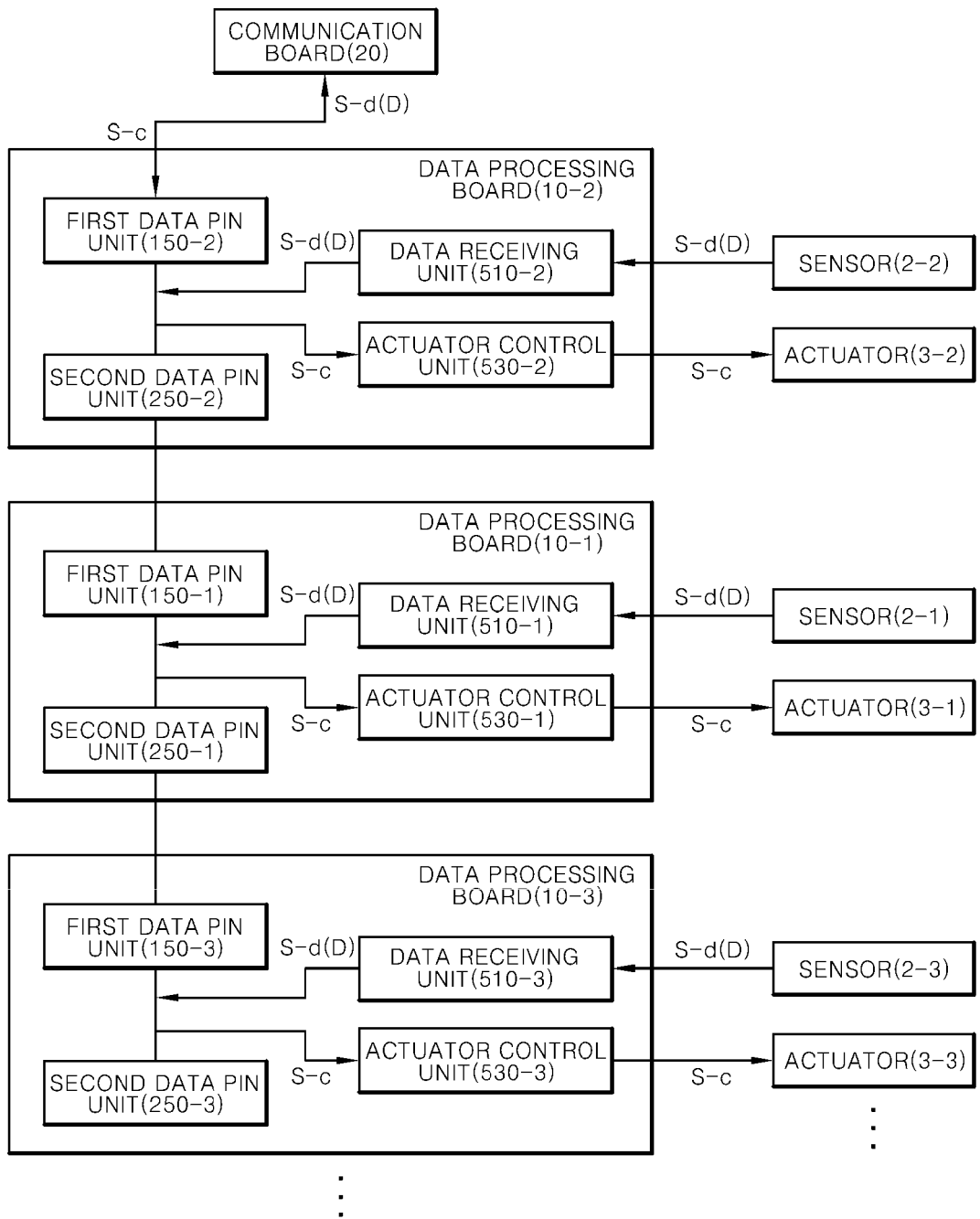
FIG. 7 is a block diagram showing a detailed configuration of the data processing module according to an embodiment of the present disclosure.

Next, as shown in FIGS. 6 and 7, the data processing module 30 including the identifier automatic assigning data processing board according to an embodiment of the present disclosure includes at least one data processing board 10 connected to at least one of the sensor 2 and the actuator 3 to transmit and receive the processing signal S and assign an identifier according to the voltage value measured in the internal circuit; and a communication board 20 configured to make a call to the data processing board 10 through the identifier and transmit and receive the processing signal S to/from the data processing board 10 according to a response of the data processing board 10 to the call.

Hereinafter, each component of the data processing module 30 according to an embodiment of the present disclosure will be described in detail with reference to FIGS. 6 and 7.

First, the data processing board 10 may be connected to at least one of the sensor 2 and the actuator 3 to transmit and receive the processing signal S, and may assign an identifier according to a voltage value measured in the internal circuit.

Here, at least one data processing board 10 may include the data processing board 10-1, another data processing board 10-2 and still another data processing board 10-3 as described above, and accordingly, the data processing board 10 included in the data processing module 30 will not be described in detail again.

Meanwhile, the processing signal S transmitted to and received from at least one of the sensor 2 and the actuator 3 by the data processing board 10 may include at least any one of a data signal S-d containing the sensing data D output from the sensor 2 and the control signal S-c for controlling the operation of the actuator 3.

Here, the sensing data D may be a data packet including a type value of the sensor 2 and sensing values collected by the sensor 2, and the type value of the sensor 2 may vary depending on whether the sensor 2 is an analog-type sensor or a digital-type sensor.

As described above, the data processing board 10 may include the data receiving unit 510 and the actuator control unit 530, the data receiving unit 510 may receive the data signal S-d containing the sensing data D output from the sensor 2 and transmit the data signal S-d to the communication board 20, explained later, and the actuator control unit 530 may control the operation of the actuator 3 through the control signal S-c received from the communication board 20.

Subsequently, the communication board 20 makes a call to the data processing board 10 through the identifier and transmits and receives the processing signal S to/from the data processing board 10 according to a response of the data processing board 10 to the call.

The data processing board 10 may be automatically assigned with an identifier according to the voltage value measured in the internal circuit as described above, and the communication board 20 makes a call to the data processing board 10 through the identifier automatically assigned to the data processing board 10.

Meanwhile, the communication board 20 and the data processing board 10 according to an embodiment of the present disclosure may be connected to each other through serial communication. The serial communication method has a disadvantage in that the amount of processing signals that can be processed at a time is small compared to parallel communication, but has an advantage in that signal processing is possible with a simple configuration using a small number of signal lines.

Meanwhile, as shown in FIG. 7, if two or more data processing boards 10 are provided, the two or more data processing boards 10 are respectively connected to the communication board 20 in parallel.

As an example, the communication board 20 may connect two or more data processing boards 10 by RS485 communication in a multi-drop method.

Since an identifier is automatically assigned to each of two or more data processing boards 10, the communication boards 20 and the two or more data processing boards 10 may transmit/receive the processing signal S by the call and the response through the automatically assigned identifier.

More specifically, if the data processing board 10 may include a first data pin unit 150 and a second data pin unit 250 as described above and two or more data processing boards 10 are connected in parallel to the communication board 20, the first data pin unit 150 and the second data pin unit 250 may be electrically connected to each other to form a data bus.

At this time, the data receiving unit 510 included in the data processing board 10 may transmit the sensing data D to the communication board 20 through the data bus, and the actuator control unit 530 may receive the control signal S-c from the communication board 20 through the data bus.

Meanwhile, the communication board 20 according to an embodiment of the present disclosure receives at least one sensing data D from each data processing board 10 and assigns a serial number to the received at least one sensing data D to generate a data packet including the at least one sensing data D and the serial number.

At this time, the communication board 20 may sequentially receive at least one sensing data D from each data processing board 10 and assigns a serial number according to the received order, thereby assigning the serial number and sequentially generating the data packets including the at least one sensing data D.

The data packets generated by the communication board 20 may be sequentially transmitted to the data processing system 60, explained later.

Meanwhile, the communication board 20 may transmit and receive the processing signal S to/from an external device, and may use, for example, a radio frequency (RF) wireless communication method. However, without being limited thereto, the communication board 20 may transmit and receive the processing signal S to/from the external device through various wireless communication methods, and may also transmit and receive the processing signal S with the external device by a wired communication method as well as the wireless communication method.

Figure 8:
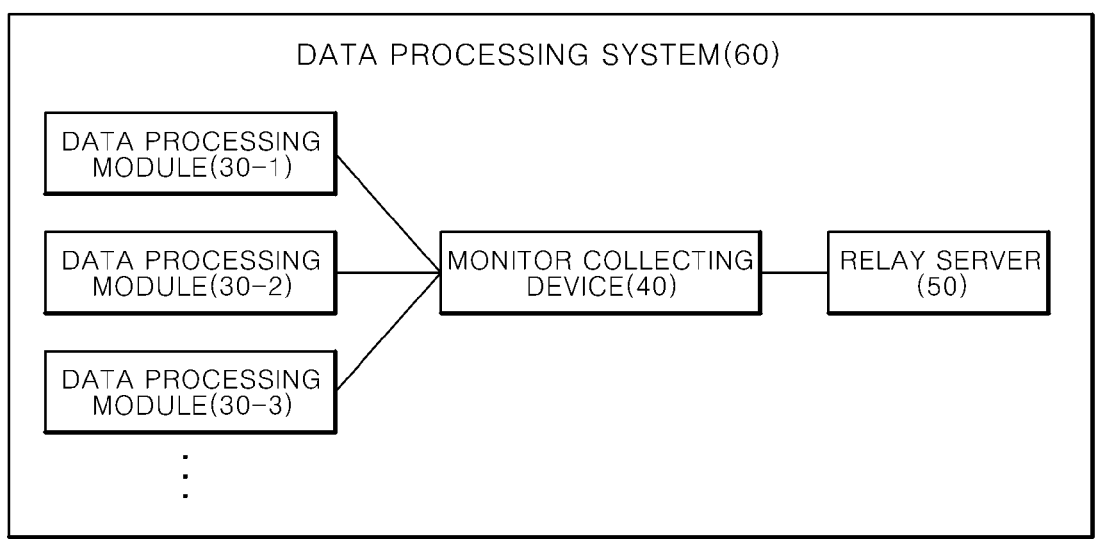
FIG. 8 is a block diagram showing an overall configuration of a data processing system according to an embodiment of the present disclosure.
Figure 9:
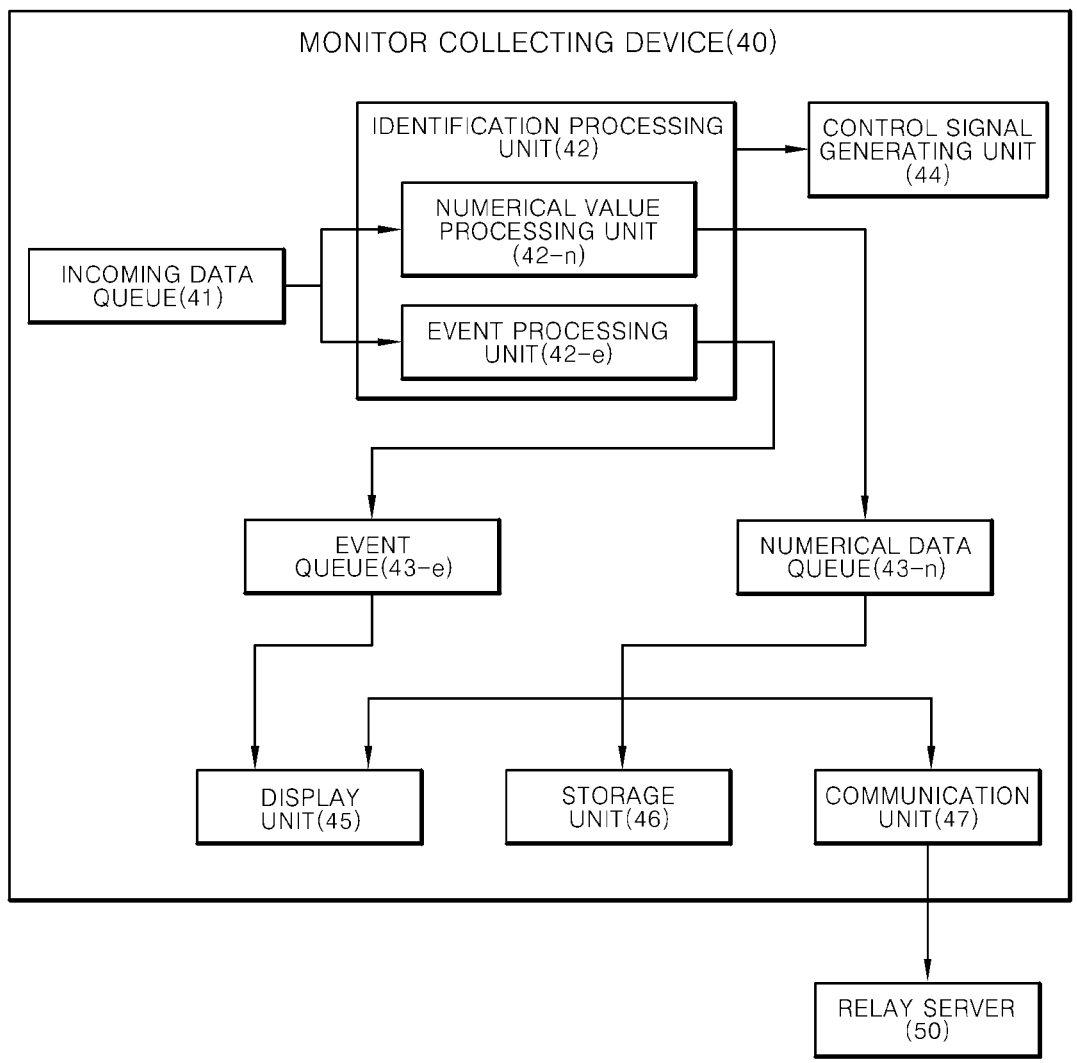
FIG. 9 is a block diagram showing an overall configuration of a monitor collecting device according to an embodiment of the present disclosure and a relay server connected to the monitor collecting device.
Figure 10:
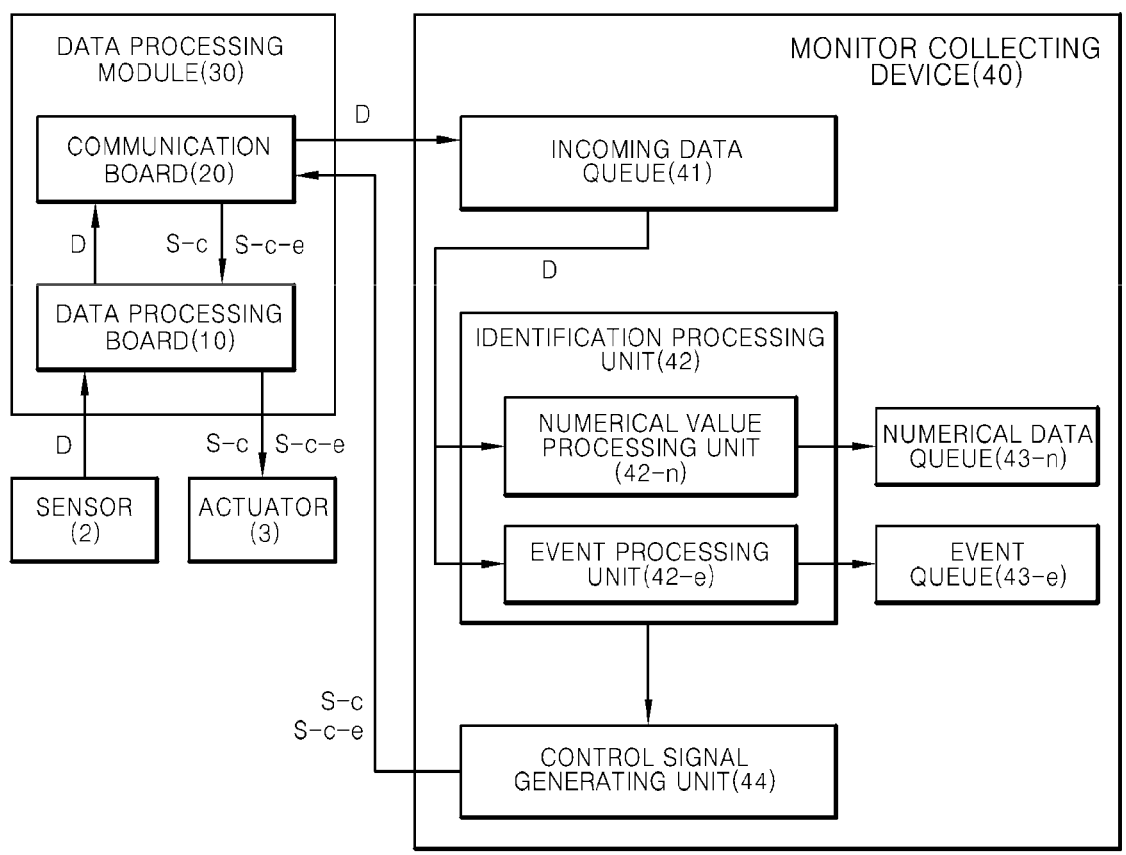
FIG. 10 is a block diagram showing a monitor collecting device and a data processing module according to an embodiment of the present disclosure.

Next, as shown in FIGS. 8 to 10, a data processing system 60 including the data processing module according to an embodiment of the present disclosure includes at least one data processing module 30, which has at least one data processing board 10 connected to at least one of the sensor 2 and the actuator 3 to transmit and receive at least one of the sensing data D output from the sensor 2 and the control signal S-c for controlling the operation of the actuator 3, and a communication board 20 for receiving the sensing data D from the data processing board 10; and a monitor collecting device 40 for receiving the sensing data D from the communication board 20 to perform data processing for the sensing data D.

Hereinafter, each component of the data processing system 60 according to an embodiment of the present disclosure will be described in detail with reference to FIGS. 8 to 10.

First, the data processing module 30 includes at least one data processing board 10 connected to at least one of the sensor 2 and the actuator 3 to transmit and receive at least one of the sensing data D output from the sensor 2 and the control signal S-c for controlling the operation of the actuator 3, and a communication board 20 for collecting the sensing data D from the data processing board 10.

Here, the at least one data processing module 30 included in the data processing system 60 may be the data processing module 30 described above, and accordingly, the data processing module 30 included in the data processing system 60 will not be described in detail again.

In addition, the at least one data processing board 10 included in the data processing module 30 may be the data processing board 10 described above, and accordingly, the data processing board 10 included in the data processing module 30 will not be described in detail again.

The data processing module 30 may manage an experiment space or an experiment device, for example, by receiving the sensing data D from the sensor 2 provided in the experiment space or the experiment device or by controlling the actuator 3 provided in the experiment space.

Subsequently, the monitor collecting device 40 receives the sensing data D from the communication board 20 and performs data processing for the sensing data D.

As described above, the communication board 20 included in the data processing module 30 may transmit and receive the processing signal S to/from the external device in an RF wireless communication method, and at this time, as an example of the external device, the monitor collecting device 40 may be connected to the communication board 20 in an RF wireless communication method to transmit and receive the sensing data D, the control signal S-c or the like.

The monitor collecting device 40 may make a call to the data processing module 30 in an RF wireless communication method, and the called data processing module 30 may transmit the collected sensing data D to the monitor collecting device 40.

At this time, if there is no response from the data processing module 30 according to the call of the monitor collecting device 40, the monitor collecting device 40 may determine whether the data processing module 30 is abnormal, and the data processing module 30 may be determined as an abnormal state when the call of the monitor collecting device 40 is not received.

Meanwhile, the monitor collecting device 40 according to an embodiment of the present disclosure includes an incoming data queue 41 for storing the sensing data D received from the communication board 20; and at least one identification processing unit 42 for receiving the sensing data D from the incoming data queue 41 and performing data processing for the sensing data D.

First, the incoming data queue 41 may store the sensing data D received from the data processing module 30. More specifically, the incoming data queue 41 may be assigned with a serial number generated by the communication board 20 of the data processing module 30, described above, and store a data packet including at least one sensing data D (the sensing data D may be a data packet including the type value of the sensor 2 and the collected sensing value of the sensor 2 as described above).

The incoming data queue 41 may sequentially store data packets received from the communication board 20 and transmit the stored data packets to the identification processing unit 42 in a multicasting method.

The identification processing unit 42 receives the sensing data D from the incoming data queue 41 and performs data processing for the sensing data D.

At this time, the monitor collecting device 40 may have one or more identification processing units 42. If two or more identification processing units 42 are provided, the identification processing units 42 may receive the data packet from the incoming data queue 41 in a multicasting method and perform parallel data processing for the sensing data D included in the data packet.

Meanwhile, the identification processing unit 42 selects the sensing data D according to the type value of the sensor 2 included in the sensing data D and performs data processing for the sensing data D.

As described above, each data processing module 30 may receive the sensing data D output from a digital-type sensor or an analog-type sensor, and at this time, the identification processing unit 42 may select the sensing data D to be processed according to the preset type value condition of the sensor 2 and selectively perform data processing for the sensing data D received from the incoming data queue 41.

The data processing module 30 according to an embodiment of the present disclosure only transmits and receives the sensing data D from each sensor 2, and does not have a data processing function for the sensing data D, so a more efficient data processing method is required for the monitor collecting device 40.

At this time, the identification processing unit 42 provided to the monitor collecting device 40 selects and processes the sensing value contained in the sensing data D according to the type value of the sensor 2 contained in the sensing data D, thereby enabling more efficient data processing.

Meanwhile, the identification processing unit 42 according to an embodiment of the present disclosure includes a numerical value processing unit 42-*n* for performing data processing for the sensing value contained in the sensing data D; and an event processing unit 42-*e* for detecting whether an event occurs according to the sensing value contained in the sensing data D.

First, the numerical value processing unit 42-*n* performs data processing for the sensing value contained in sensing data D, and for example, functions to outputs a numerical value so as to be identified by a user, by calculating and changing the sensing value contained in the sensing data D.

Meanwhile, the event processing unit 42-*e* detects whether an event such as an abnormal situation or a dangerous situation occurs according to the sensing value contained in the sensing data D.

For example, the event processing unit 42-*e* may analyze the pattern of the sensing value contained in the sensing data D, compare the pattern with the pattern of a preset sensing value that is regarded as an event occurs, and detect only whether an event occurs without performing separate data processing such as calculation or change for the sensing value if it is determined that an event occurs.

The data processing module 30 according to an embodiment of the present disclosure only transmits and receives the sensing data D from each sensor 2, and does not have a data processing function for the sensing data D, so a more efficient data processing method is required for the monitor collecting device 40.

At this time, since the identification processing unit 42 provided in the monitor collecting device 40 includes the numerical value processing unit 42-*n* and the event processing unit 42-*e* and thus performs data processing for the sensing value contained in the sensing data D and detection of the occurrence of an event in a separated way, thereby enabling more efficient data processing.

Meanwhile, the monitor collecting device 40 according to an embodiment of the present disclosure further includes a control signal generating unit 44 that generates a control signal S-c for controlling the operation of the actuator 3.

The control signal S-c generated by the control signal generating unit 44 may be sequentially transmitted to the data processing module 30 and the data processing board 10, and the actuator control unit 530 of the data processing board 10 may control the operation of the actuator 3 connected to the data processing board 10 according to the transmitted control signal S-c.

Meanwhile, if an event occurs, the control signal generating unit 44 may generate an emergency response control signal S-c-e for controlling the actuator 3 such that the actuator 3 performs an operation corresponding to the event.

If an event is detected by the event processing unit 42-*e*, the control signal generating unit 44 may generate an emergency response control signal S-c-e and transmits the emergency response control signal S-c-e to the data processing module 30, so that the operation of the actuator 3 is controlled by the data processing board 10 provided in the data processing module 30.

For example, actuator 3 may include a buzzer, a warning lamp, a solenoid valve, or the like, and the data processing board 10 receiving the emergency response control signal S-c-e may control the buzzer to sound according to the emergency response control signal S-c-e, control the warning lamp to emit light, or control the solenoid valve to be closed.

Meanwhile, the monitor collecting device 40 according to an embodiment of the present disclosure may further include a numerical data queue 43-*n* for storing the numerical value processed by the numerical value processing unit 42-*n*, and an event queue 43-*e* for storing the event detected by the event processing unit 42-*e*.

First, the numerical data queue 43-*n* may sequentially store the numerical values processed by the numerical value processing unit 42-*n*, and transmit the stored numerical values to the display unit 45, the storage unit 46, the communication unit 47 and the like included in the monitor collecting device 40 in a multicasting method.

The display unit 45 may display the numerical values received from the numerical data queue 43-*n* to the user, and in this case, delayed numerical values may not be displayed.

The storage unit 46 sequentially stores the numerical values received from the numerical data queue 43-*n*.

The event queue 43-*e* sequentially stores the events detected by the event processing unit 42-*e*, and may transmit the stored events to the display unit 45 included in the monitor collecting device 40.

The display unit 45 may display the event received from the event queue 43-*e* to the user.

Meanwhile, the data processing system 60 according to an embodiment of the present disclosure may further include a relay server 50 for connecting the monitor collecting device 40 to an external management PC.

More specifically, the communication unit 47 may provide the numerical values received from the numerical data queue 43-*n* to the external management PC through the relay server.

In addition, two or more monitor collecting devices 40 may be connected to the relay server 50, so that the monitor collecting devices 40 may be networked through a network provided by the relay server 50.

That is, the relay server 50 may form an IoT (Internet of Thing) environment by connecting the monitor collecting devices 40 and the external management PC or connecting the monitor collecting devices 40 to each other through a network.

As described above, since the data processing board 10-1 according to an embodiment of the present disclosure automatically assigns an identifier according to the voltage value measured in the internal circuit, a separate procedure for assigning the identifier to the data processing board 10-1 is not required.

In addition, since the internal circuit is formed differently by the switching unit 430-1 depending on whether still another data processing board 10-3 is connected in series to the data processing board 10-1, even if a plurality of still another data processing boards 10-3 are sequentially connected in series to the data processing board 10-1, all of the data processing board 10-1 and the plurality of still another data processing boards 10-3 sequentially connected in series may be automatically assigned with an identifier.

Meanwhile, since the data processing module 30 according to an embodiment of the present disclosure includes the data processing board 10 configured to automatically assign an identifier according to the voltage value measured in the internal circuit and also assigns an identifier by constituting the internal circuit differently according to the serial connection state, there is an effect of giving an expandability that can increase the number of data processing boards 10 according to the environment of an experiment space or an experiment device managed by the data processing module 30.

In addition, by providing the data processing board 10 that may be connected to various types of sensors 2 and actuators 3 to transmit and receive the processing signal S, the types of sensors 2 and actuators 3 connected to the data processing board 10 may be changed in various ways according to the environment of an experiment space an experiment device managed by the data processing module 30.

Meanwhile, the data processing system 60 according to an embodiment of the present disclosure has an effect of more efficiently processing data by selectively processing the sensing data D received from the data processing module 30 according to the type value.

In addition, since data processing for the sensing value contained in the sensing data D and detecting whether an event occurs by the sensing value contained in the sensing data D are performed separately in parallel, data processing may be performed more efficiently.

Heretofore, even though it has been described that all the components constituting the embodiment of the present disclosure are coupled into one or operate in combination, the present disclosure is not necessarily limited to this embodiment. In other words, within the scope of the purpose of the present disclosure, among all components, one or more components may be selectively coupled and operate.

The above disclosure is merely an illustrative explanation of the technical idea of the present disclosure, and those with ordinary knowledge in the technical field to which the present disclosure belongs can make various changes and modifications within the scope not departing from the essential characteristics of the present disclosure. Accordingly, the embodiments in the present disclosure are not intended to limit the technical idea of the present disclosure, but to illustrate the technical idea, and the scope of the technical idea of the present disclosure is not limited by the embodiment. The scope of the present disclosure should be interpreted by the appended claims, and all technical ideas within the equivalent scope should be construed as falling within the scope of the present disclosure.

What is claimed is:

1. A data processing module comprising:
an identifier automatic assigning data processing board connected to at least one of a sensor and an actuator to transmit and receive a processing signal and configured to assign an identifier according to a voltage value measured in an internal circuit, the identifier automatic assigning data processing board comprising:
a first input pin configured to receive a power from an external power source or another data processing board connected in series;
a resistor unit having one end connected in series to the first input pin;
a voltage measuring unit connected in series to the other end of the resistor unit to measure a voltage value at the other end of the resistor unit;

an identifier assigning unit configured to assign the identifier based on the voltage value measured by the voltage measuring unit;

a switching unit connected in series to the voltage measuring unit and having a switch;

a switching control unit connected in the switching unit and configured to control the switching unit to turn off the switch when another data processing board is connected in series with the identifier automatic assigning data processing board and control the switching unit to turn on the switch when the another data processing board is disconnected from the identifier automatic assigning data processing board, wherein, when the another data processing board is connected in series with the identifier automatic assigning data processing board, the identifier assigning unit is configured to assign the identifier based on the voltage value that is changed according to the switching unit of which the switch is turned off by the serial connection of the another data processing board; and a communication board configured to make a call to the identifier automatic assigning data processing board through the identifier and transmit and receive the processing signal to/from the identifier automatic assigning data processing board according to a response of the identifier automatic assigning data processing board to the call.

2. The data processing module according to claim 1, wherein the data processing board comprises a first output pin having the other end connected in series to the switching unit and one end connected in series to a ground of the external power source or a second input pin of the another data processing board.

3. The data processing module according to claim 1, wherein when the another data processing board is connected in series, the data processing board comprises a second output pin having one end connected in series to the voltage measuring unit and the other end connected in series to a first input pin of the another data processing board.

4. The data processing module according to claim 2, wherein when the another data processing board is connected in series, the data processing board comprises a second input pin having one end connected in series to the first output pin and the other end connected in series to a first output pin of the another data processing board.

5. The data processing module including an identifier automatic assigning data processing board according to claim 1, wherein when two or more data processing boards are provided, the two or more data processing boards are connected to the communication board in parallel.

6. The data processing module including an identifier automatic assigning data processing board according to claim 1, wherein the processing signal includes any one of a data signal containing sensing data output by the sensor and a control signal for controlling an operation of the actuator.

7. A data processing system comprising:

At least one data processing module including an identifier automatic assigning data processing board connected to at least one of a sensor and an actuator to transmit and receive any one of sensing data output by the sensor and a control signal for controlling an operation of the actuator, and a communication board for collecting the sensing data from the data processing board, the identifier automatic assigning data processing board comprising:

a first input pin configured to receive a power from an external power source or another data processing board connected in series;

a resistor unit having one end connected in series to the first input pin;

a voltage measuring unit connected in series to the other end of the resistor unit to measure a voltage value at the other end of the resistor unit;

an identifier assigning unit configured to assign the identifier based on the voltage value measured by the voltage measuring unit;

a switching unit connected in series to the voltage measuring unit and having a switch:

a switching control unit connected in the switching unit and configured to control the switching unit to turn off the switch when another data processing board is connected in series with the identifier automatic assigning data processing board and control the switching unit to turn on the switch when the another data processing board is disconnected from the identifier automatic assigning data processing board, wherein, when the another data processing board is connected in series with the identifier automatic assigning data processing board, the identifier assigning unit is configured to assign the identifier based on the voltage value that is changed according to the switching unit of which the switch is turned off by the serial connection of the another data processing board; and a monitor collecting device configured to receive the sensing data from the communication board and perform data processing for the sensing data.

8. The data processing system including a data processing module according to claim 7, wherein the monitor collecting device includes:

an incoming data queue configured to store the sensing data received from the communication board; and at least one identification processing unit configured to receive the sensing data from the incoming data queue and perform data processing for the sensing data.

9. The data processing system including a data processing module according to claim 8, wherein the identification processing unit selects the sensing data according to a type value of the sensor contained in the sensing data and perform data processing for the selected sensing data.

10. The data processing system including a data processing module according to claim 8, wherein the identification processing unit includes:

a numerical value processing unit configured to perform data processing for a sensing value contained in the sensing data; and an event processing unit configured to detect whether an event occurs, according to the sensing value contained in the sensing data.

11. The data processing system including a data processing module according to claim 8, wherein the monitor collecting device further includes a control signal generating unit configured to generate the control signal for controlling an operation of the actuator.

* * * * *